United States Patent
Etter et al.

(10) Patent No.: US 11,948,933 B2
(45) Date of Patent: Apr. 2, 2024

(54) SEMICONDUCTOR DEVICES AND METHODS OF MANUFACTURING SEMICONDUCTOR DEVICES

(71) Applicant: SEMICONDUCTOR COMPONENTS INDUSTRIES, LLC, Phoenix, AZ (US)

(72) Inventors: Steven M. Etter, Phoenix, AZ (US); Yupeng Chen, San Jose, CA (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 46 days.

(21) Appl. No.: 17/650,451

(22) Filed: Feb. 9, 2022

(65) Prior Publication Data
US 2023/0253397 A1    Aug. 10, 2023

(51) Int. Cl.
*H01L 27/02* (2006.01)
*H01L 29/866* (2006.01)

(52) U.S. Cl.
CPC ........ *H01L 27/0248* (2013.01); *H01L 29/866* (2013.01)

(58) Field of Classification Search
CPC ............. H01L 29/0646; H01L 29/0649; H01L 29/732; H01L 29/0619–0623; H01L 29/7811; H01L 29/7823; H01L 29/86; H01L 27/0255; H01L 27/0248; H01L 27/0623–0635; H01L 27/0647; H01L 27/0652; H01L 27/0664–0676; H01L 27/0711–0727; H01L 27/075–0766; H01L 27/0783; H01L 27/0266; H01L 27/0259; H01L 25/03; H01L 25/04;

(Continued)

(56) References Cited

U.S. PATENT DOCUMENTS 5,696,391 A * 12/1997 Bernier .................. H02H 9/041
257/120
7,538,395 B2    5/2009 Keena et al.
(Continued)

FOREIGN PATENT DOCUMENTS

CN          101714759 A        5/2010
KR        2017091887 A  *   8/2017  ............. H01L 23/62

OTHER PUBLICATIONS

Jang et al., Transient voltage suppressor and manufacturing method thereof, 2017, machine translation of KR 2017-0091887 A, pp. 1-5. (Year: 2017).*

*Primary Examiner* — Natalia A Gondarenko
(74) *Attorney, Agent, or Firm* — Kevin B. Jackson

(57) ABSTRACT

In an example, a semiconductor device includes a first steering diode and a second steering diode at a top side of a region of semiconductor material, a first Zener diode buried within the region of semiconductor material, and a second Zener diode at a bottom side of the region of semiconductor material. The semiconductor device is configured as a bi-directional electrostatic discharge (ESD) structure. The first Zener diode and the first steering diodes are configured to respond to a positive ESD pulse, and the second Zener diode and the second steering diode are configured to respond to a negative ESD pulse. The steering diodes are configured to have low capacitances and the Zener diodes are configured to provide enhanced ESD protection. Other related examples and methods are disclosed herein.

20 Claims, 7 Drawing Sheets

(58) Field of Classification Search
CPC .............. H01L 25/065; H01L 25/0652; H01L 25/0655; H01L 29/866; H01L 27/0296; H01L 27/0814; H01L 29/861; H01L 29/0684; H01L 29/8613
USPC ....... 257/355, 183, 124, 274, 173, 146, 112, 257/607
See application file for complete search history.

(56) References Cited

U.S. PATENT DOCUMENTS

| | | |
|---|---|---|
| 10,535,648 B2 | 1/2020 | Chen et al. |
| 2011/0309476 A1* | 12/2011 | Mita .................. H01L 27/0814 |
| | | 438/380 |
| 2015/0035114 A1* | 2/2015 | Sekine ................ H01L 27/0676 |
| | | 257/528 |
| 2015/0084162 A1* | 3/2015 | Davis ................ H01L 29/8611 |
| | | 438/510 |

\* cited by examiner

SEMICONDUCTOR DEVICES AND METHODS OF MANUFACTURING SEMICONDUCTOR DEVICES

CROSS-REFERENCE TO RELATED APPLICATIONS

Not applicable.

TECHNICAL FIELD

The present disclosure relates, in general, to electronics and, more particularly, to semiconductor device structures and methods of forming semiconductor devices.

BACKGROUND

Prior semiconductor devices and methods for forming semiconductor devices are inadequate, for example resulting in excess cost, inadequate integration, decreased reliability, relatively low performance, or dimensions that are too large.

For example, prior low capacitance electrostatic discharge (ESD) protection devices in which current flows vertically through a first die have been configured as unidirectional devices. To make the ESD protection devices bi-directional, a second die is added to the first die in series, which required two input/outputs (I/Os). In other configurations, two I/Os in one in series with two bond wires was used. Having two separate die or two I/Os reduces the effectiveness of the ESD protection, uses more semiconductor die area, and increases assembly costs. In addition, previous approaches to single die bidirectional ESD protection devices have been unsatisfactory including poor ESD survival and high capacitance.

Accordingly, structures and methods are needed for bidirectional ESD devices that improve performance without increasing capacitance and that decrease package size and manufacturing costs.

Further limitations and disadvantages of conventional and traditional approaches will become apparent to one of skill in the art, through comparison of such approaches with the present disclosure and reference to the drawings.

Figure 1:
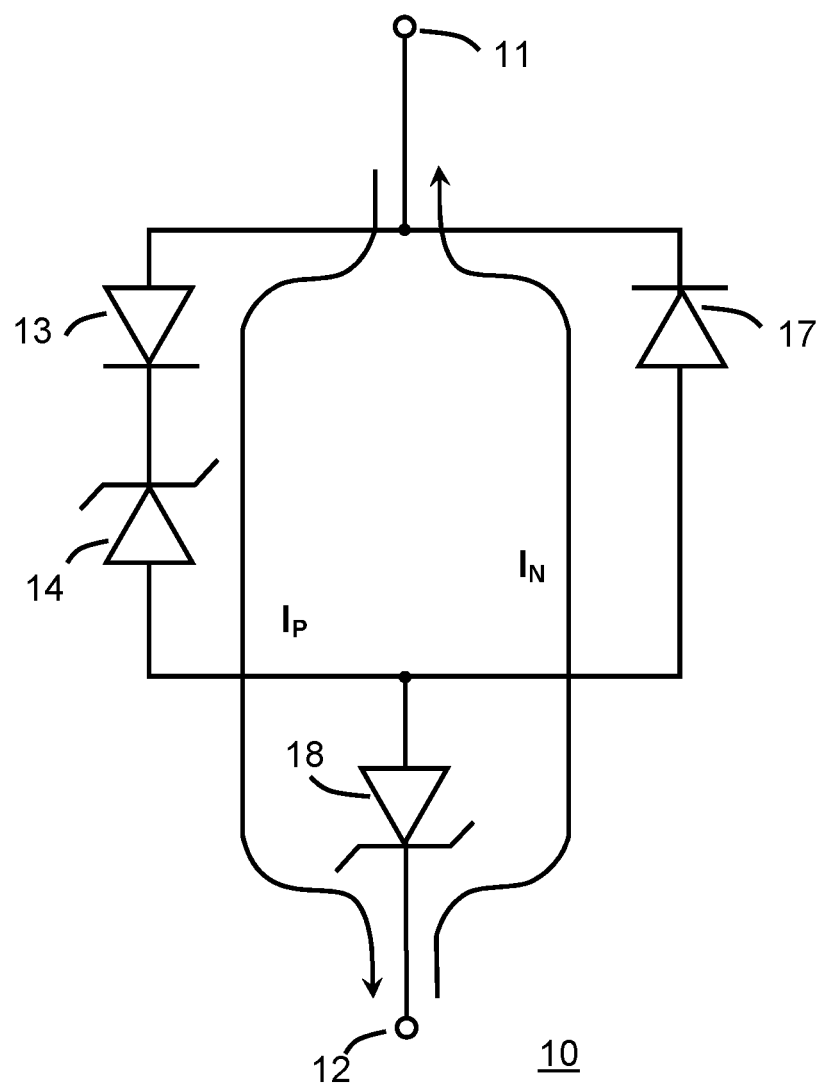
FIG. 1 schematically illustrates a portion of a circuit representation of a semiconductor device configured as an electrostatic discharge (ESD) device in accordance with the present description.

The following discussion provides various examples of semiconductor devices and methods of manufacturing semiconductor devices. Such examples are non-limiting, and the scope of the appended claims should not be limited to the particular examples disclosed. In the following discussion, the terms "example" and "e.g." are non-limiting.

For simplicity and clarity of the illustration, elements in the figures are not necessarily drawn to scale, and the same reference numbers in different figures denote the same elements. Additionally, descriptions and details of well-known steps and elements are omitted for simplicity of the description.

For clarity of the drawings, certain regions of device structures, such as doped regions or dielectric regions, may be illustrated as having generally straight-line edges and precise angular corners. However, those skilled in the art understand that, due to the diffusion and activation of dopants or formation of layers, the edges of such regions generally may not be straight lines and that the corners may not be precise angles.

Although the semiconductor devices are explained herein as certain N-type conductivity regions and certain P-type conductivity regions, a person of ordinary skill in the art understands that the conductivity types can be reversed and are also possible in accordance with the present description, taking into account any necessary polarity reversal of voltages, inversion of transistor type and/or current direction, etc.

In addition, the terminology used herein is for the purpose of describing particular examples only and is not intended to be limiting of the disclosure. As used herein, the singular forms are intended to include the plural forms as well, unless the context clearly indicates otherwise.

As used herein, "current-carrying electrode" means an element of a device that carries current through the device, such as a source or a drain of an MOS transistor, an emitter or a collector of a bipolar transistor, or a cathode or anode of a diode, and a "control electrode" means an element of the device that controls current through the device, such as a gate of a MOS transistor or a base of a bipolar transistor.

The term "major surface" when used in conjunction with a semiconductor region, wafer, or substrate means the surface of the semiconductor region, wafer, or substrate that forms an interface with another material, such as a dielectric, an insulator, a conductor, or a polycrystalline semiconductor. The major surface can have a topography that changes in the x, y and z directions.

The terms "comprises", "comprising", "includes", and/or "including", when used in this description, are open ended terms that specify the presence of stated features, numbers, steps, operations, elements, and/or components, but do not preclude the presence or addition of one or more other features, numbers, steps, operations, elements, components, and/or groups thereof.

The term "or" means any one or more of the items in the list joined by "or". As an example, "x or y" means any element of the three-element set {(x), (y), (x, y)}. As another example, "x, y, or z" means any element of the seven-element set {(x), (y), (z), (x, y), (x, z), (y, z), (x, y, z)}.

Although the terms "first", "second", etc. may be used herein to describe various members, elements, regions, layers and/or sections, these members, elements, regions, layers and/or sections should not be limited by these terms. These terms are only used to distinguish one member, element, region, layer and/or section from another. Thus, for example, a first member, a first element, a first region, a first layer and/or a first section discussed below could be termed a second member, a second element, a second region, a second layer and/or a second section without departing from the teachings of the present disclosure.

It will be appreciated by one skilled in the art that words, "during", "while", and "when" as used herein related to circuit operation are not exact terms that mean an action takes place instantly upon an initiating action but that there may be some small but reasonable delay, such as propagation delay, between the reaction that is initiated by the initial action. Additionally, the term "while" means a certain action occurs at least within some portion of a duration of the initiating action.

The use of word "about", "approximately", or "substantially" means a value of an element is expected to be close to a state value or position. However, as is well known in the art there are always minor variances preventing values or positions from being exactly stated.

Unless specified otherwise, as used herein, the word "over" or "on" includes orientations, placements, or relations where the specified elements can be in direct or indirect physical contact.

Unless specified otherwise, as used herein, the word "overlapping" includes orientations, placements, or relations where the specified elements can at least partly or wholly coincide or align in the same or different planes.

It is further understood that the examples illustrated and described hereinafter suitably may have examples and/or may be practiced in the absence of any element that is not specifically disclosed herein.

DETAILED DESCRIPTION OF THE DRAWINGS

In general, the present examples relate to semiconductor device structures and methods of making semiconductor devices, such as electrostatic discharge (ESD) devices that utilize a large area Zener diode provided at a back side of a semiconductor substrate, which is in series with a low capacitance steering diode at a top side of the semiconductor substrate. This combination is in parallel with another low capacitance steering diode in series with a large area subsurface Zener diode. The two structures provide a bidirectional ESD device within a single semiconductor die. The area of the steering diodes is minimized to keep the capacitance of the ESD structure low, and the areas of the two Zener diodes can be independently maximized to increase ESD performance. Also, the structures and methods reduce die area, reduce package size, and reduce I/O requirements thereby reducing manufacturing complexity and costs. In some examples, double sided photolithographic masking techniques, ion implantation, and localized annealing can be used to form the Zener diode at the back side of the semiconductor substrate.

In an example, a semiconductor device includes a first terminal and a second terminal. A first P-N diode having an anode is coupled to the first terminal and a cathode. A first Zener diode is in a series combination with the first P-N diode and has a cathode coupled to the cathode of the first P-N diode and an anode. A second P-N diode is coupled in parallel with the series combination of the first P-N diode and the first Zener diode, the second P-N diode having a cathode coupled to the first terminal and an anode. A second Zener diode has a cathode coupled to the second terminal and an anode, the anode of the second Zener diode is coupled to the anode of the second P-N diode and coupled to the anode of the first Zener diode. The semiconductor device includes a semiconductor substrate of a first conductivity type having a first peak dopant concentration no less than approximately $1.0 \times 10^{19}$ atoms/cm$^3$. The semiconductor device includes a first semiconductor region of a second conductivity type opposite to the first conductivity type and having approximately the first peak dopant concentration, wherein the first semiconductor region forms a first P-N junction with the semiconductor substrate, and the first P-N junction forms a junction of the first Zener diode. The semiconductor device includes a second semiconductor region of the second conductivity type on the first semiconductor region, wherein the second semiconductor region has a second peak dopant concentration that is less than the first peak dopant concentration. The semiconductor device includes a first doped region of the first conductivity type in the second semiconductor region and overlying the first semiconductor region. The semiconductor device includes a third semiconductor region laterally adjacent to the first semiconductor region and having the first conductivity type and a third peak dopant concentration. The semiconductor device includes a fourth semiconductor region of the first conductivity type on the third semiconductor region and having a fourth peak dopant concentration that is less than the third peak dopant concentration. The semiconductor device includes a second doped region of the second conductivity type positioned in the fourth semiconductor region and overlying the third semiconductor region. The semiconductor device includes a third doped region of the second conductivity type positioned at a bottom side of the semiconductor substrate and having approximately the first peak dopant concentration to provide a second P-N junction with the semiconductor substrate, wherein the second P-N junction forms a junction of the second Zener diode.

In an example, a semiconductor device includes a semiconductor substrate of a first conductivity type having a first peak dopant concentration, a top side, and a bottom side opposite to the top side. A first semiconductor region of a second conductivity type opposite to the first conductivity type is at a first portion of the top side, wherein the first semiconductor region has approximately the first peak dopant concentration and forms a first P-N junction with the semiconductor substrate, and the first P-N junction forms a junction of a first Zener diode. A second semiconductor region of the second conductivity type overlies the first semiconductor region and has a second peak dopant concentration less than the first peak dopant concentration. A first doped region of the first conductivity type is in the second semiconductor region and overlies the first semiconductor region, wherein the first doped region forms a second P-N junction with the second semiconductor region. A third semiconductor region at a second portion of the top side laterally adjacent to the first semiconductor region and having the first conductivity type and a third peak dopant concentration. A fourth semiconductor region of the first conductivity type overlies the third semiconductor region and has a fourth peak dopant concentration less than the third peak dopant concentration. A second doped region of the second conductivity type is in the fourth semiconductor region and overlies the third semiconductor region, wherein the second doped region forms a third P-N junction with the fourth semiconductor region. A third doped region of the second conductivity type is at a bottom side of the semiconductor substrate and having approximately the first peak dopant concentration, the third doped region forms a fourth P-N junction with the semiconductor substrate, wherein the fourth P-N junction forms a junction of a second Zener diode. A first conductor is coupled to the first doped region and the second doped region at the top side. A second conductor is coupled to the second Zener diode at the bottom side of the semiconductor substrate.

In an example, a method of forming a semiconductor device includes providing a semiconductor substrate of a first conductivity type having a first peak dopant concentration, a top side, and a bottom side opposite to the first side. The method includes providing a first semiconductor region of a second conductivity type opposite to the first conductivity type at a first portion of the top side, wherein the first semiconductor region has approximately the first peak dopant concentration and forms a first P-N junction with the semiconductor substrate, and the first P-N junction forms a junction of a first Zener diode. The method includes providing a second semiconductor region of the first conductivity type having a second peak dopant concentration at a second portion of the side and laterally adjacent to the first semiconductor region. The method includes providing a third semiconductor region of the second conductivity type overlying the first semiconductor region and a fourth semiconductor region of the first conductivity type overlying the second semiconductor region, wherein the third semiconductor region has a third peak dopant concentration that is less than the first peak dopant concentration. and fourth semiconductor region has a fourth peak dopant concentration that is less than the second peak dopant concentration. The method includes providing a first doped region of the first conductivity type in the third semiconductor region and overlying the first semiconductor region, wherein the first doped region forms a second P-N junction with the third semiconductor region. The method includes providing a second doped region of the second conductivity type in the fourth semiconductor region and overlying the second semiconductor region, wherein the second doped region forms a third P-N junction with the fourth semiconductor region. The method includes providing a first conductor coupled to the first doped region and the second doped region. The method includes providing a third doped region of the second conductivity type at the bottom side of the semiconductor substrate and having approximately the first peak dopant concentration to provide a fourth P-N junction with the semiconductor substrate, wherein the fourth P-N junction forms a junction of a second Zener diode. The method includes providing a second conductor coupled to the second Zener diode at the bottom side of the semiconductor substrate.

Other examples are included in the present disclosure. Such examples may be found in the figures, in the claims, or in the description of the present disclosure.

FIG. 1 schematically illustrates a semiconductor device 10 as an embodiment of an electrostatic discharge (ESD) protection device 10 or ESD device 10. In accordance with the present description semiconductor device 10 a bi-directional device having a low capacitance and a fast response time. Semiconductor device 10 includes two terminals, a first terminal 11 and a second terminal 12. In some examples, terminal 11 is an input terminal and terminal 12 generally is an output terminal connected to another element (not shown), which is to be protected by semiconductor device 10. For example, terminal 11 may be connected to the high side of a regulated power supply (such as a five volt (V) supply). In accordance with the present description, semiconductor device 10 is configured to have a low capacitance between terminals 11 and 12. Semiconductor device 10 also is formed to limit the maximum voltage that is formed between terminals 11 and 12 to the clamp voltage of semiconductor device 10. A sharp breakdown voltage characteristic (or sharp knee) of semiconductor device 10 assists in accurately controlling the value of the clamp voltage. The low capacitance assists in providing semiconductor device 10 with a fast response time.

In accordance with the present description, semiconductor device 10 includes a first P-N junction diode 13 that is configured as a first steering diode, a first Zener diode 14 that is connected in a series combination with first P-N diode 13, and a second P-N junction diode 17 that is configured as a second steering diode. Second P-N junction diode 17 is coupled in parallel with the series combination of diodes 13 and 14. In accordance with the present description, device 10 further includes a second Zener diode 18 that is coupled in a series combination with diodes 13 and 14 and coupled in a series combination with diode 17.

In an example normal operation, semiconductor device 10 is biased to a normal operating voltage, such as a voltage that is between about one volt (1V) and the Zener voltage of diode 14, by applying about one volt (1V) to terminal 11 and a ground reference voltage to terminal 12. Because of the hereinafter described characteristics of semiconductor device 10, the capacitance of device 10 remains low as the voltage between terminals 11 and 12 varies over this normal operating voltage. However, the capacitance of an ESD device is customarily specified with zero volts applied across the device. This zero voltage condition is normally referred to as a zero bias condition. As will be seen further hereinafter, at this zero biased condition the hereinafter described low capacitance features of semiconductor device 10 forms very low capacitance values for diodes 13 and 17. Since the capacitance of capacitors in series is smaller than that of the smallest capacitor, the capacitance resulting from diodes 13 and 14 at this zero bias condition is smaller than the capacitance of either of diodes 13 or 14. The capacitance of semiconductor device 10 is the additive product of the equivalent capacitance of diodes 13 and 14 plus the capacitance of diode 17, and the equivalent capacitance of that additive product and the capacitance of diode 18. As will be seen further hereinafter, the capacitance of diode 17 is also very small, thus, the overall capacitance of semiconductor device 10 is very small at this zero bias condition.

If a positive ESD event is received on terminal 11, terminal 11 is forced to a large positive voltage relative to terminal 12. Because the anode of diode 13 is connected to terminal 11 and the cathode is connected to the cathode of diode 14, the large positive voltage forward biases diode 13 and reverse biases diode 14. As the voltage between terminals 11 and 12 reaches the positive threshold voltage of semiconductor device 10 (the forward voltage of diode 13 plus the Zener voltage of diode 14 plus the forward voltage of diode 18) a positive current (Ip) flows from terminal 11 through diodes 13, 14, and 18 to terminal 12. Diode 14 clamps the maximum voltage applied to terminal 12 to approximately the Zener voltage of diode 14 (plus the forward voltage of diode 13 and the forward voltage of diode 18). The sharp knee of diode 14 causes diode 14 to rapidly clamp the maximum voltage between terminals 11 and 12 to the Zener voltage of diode 14. The Zener voltage of diode 14 generally is about two and one-half to eighty volts (2.5 V-80 V) and preferably is about five volts (5V).

If a negative ESD event is received on terminal 11, terminal 11 is forced to a large negative voltage relative to terminal 12. Because the cathode of diode 17 is connected to terminal 11 and the anode is connected to the anode of diode 18, the large negative voltage forward biases diode 17 and reverse biases diode 18. As the voltage between terminals 11 and 12 reaches the negative threshold voltage of device 10 (the forward voltage of diode 17 plus the Zener voltage of diode 18) a negative current ($I_N$) flows from terminal 12 through diodes 18 and 17 to terminal 11. Diode 18 clamps the maximum voltage applied to terminal 11 to approximately the Zener voltage of diode 18 (plus the forward voltage of diode 17). The sharp knee of diode 18 causes diode 18 to rapidly clamp the maximum voltage between terminals 11 and 12 to the Zener voltage of diode 18. The Zener voltage of diode 18 generally is about two and one-half to eighty volts (2.5 V-80 V) and preferably is about five volts (5V). In this manner, semiconductor device 10 is configured as a generally bi-directional ESD device. In accordance with the present description and as will be described in more detail later, diode 18 is larger than diode 14 so the Zener voltages of diodes 14 and 18 do not have to be the same but can be substantially similar. For example, the Zener voltages of diodes 14 and 18 can be within a few tenths of a volt to a few volts of each other.

Figure 2A:
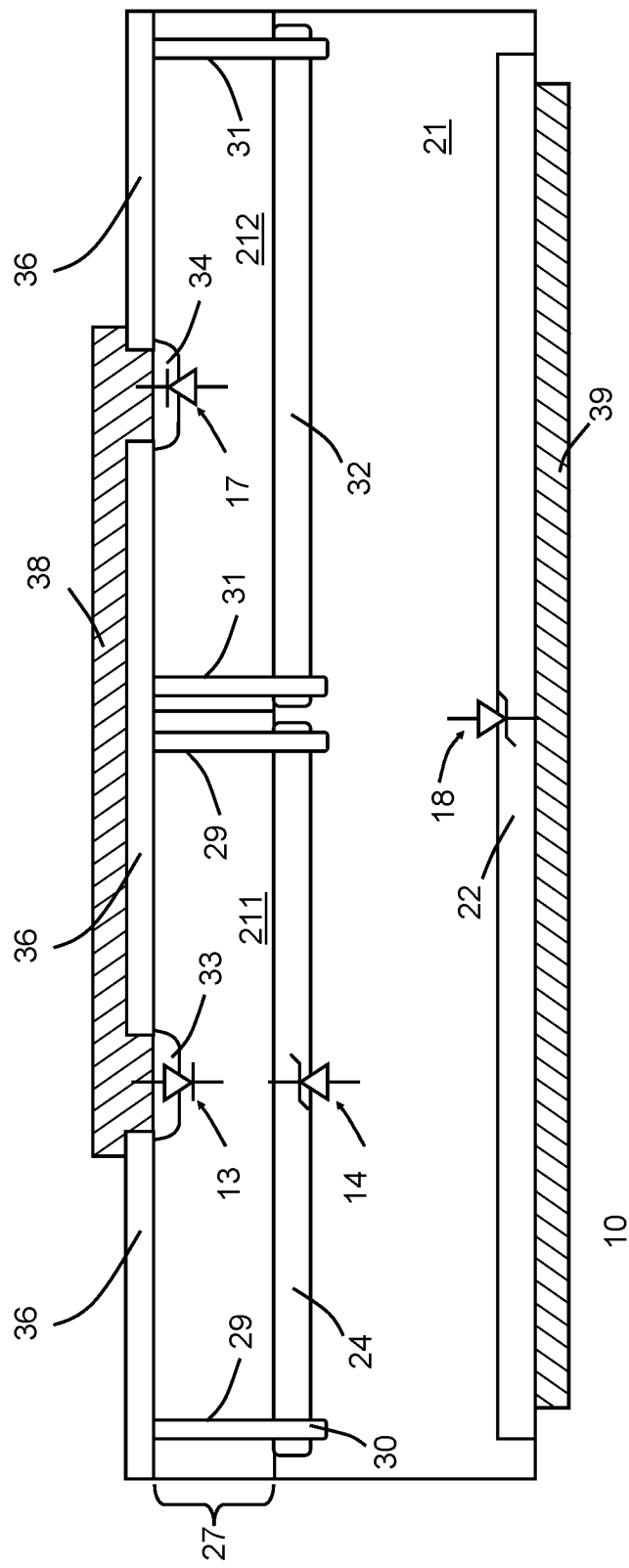
FIG. 2A illustrates a cross-sectional view of a semiconductor device in accordance with the present description.

FIG. 2A illustrates a cross-sectional view example of semiconductor device 10 in accordance with the present description. Semiconductor device 10 is configured as a bi-directional ESD device. Diodes 13, 14, 17, and 18 (which are generally referenced using arrows) are formed as part of a semiconductor substrate 21 and a semiconductor layer 27. In some examples, semiconductor substrate 21 is a silicon substrate having a P-type conductivity type and a peak dopant concentration selected to provide the desired Zener voltage for Zener diodes 14 and 18. In some examples, the peak dopant concentration of semiconductor substrate is no less than or greater than or equal to $1.0 \times 10^{19}$ atoms/cm$^3$. In other examples, the peak dopant concentration is between $1.0 \times 10^{19}$ atoms/cm$^3$ and $1 \times 10^{21}$ atoms/cm$^3$.

Semiconductor layer 27 is on, overlying, or over semiconductor substrate 21 and can be formed using, for example, epitaxial growth techniques. In accordance with the present description, semiconductor layer 27 is formed as an undoped or intrinsic semiconductor layer. That is, semiconductor layer 27 is an as-formed undoped or intrinsic silicon semiconductor layer. Instead, as will be described in more detail later, semiconductor layer 27 is doped from buried layer regions provided on or over semiconductor substrate 21 before semiconductor layer 27 is formed. In some examples, semiconductor substrate 21 and semiconductor layer 27 can be referred to as a semiconductor workpiece or a region of semiconductor material.

Semiconductor device 10 includes a semiconductor region 24 and a semiconductor region 32, which are laterally adjacent to each other and between semiconductor substrate 21 and semiconductor layer 27. In the present example, semiconductor region 24 has an N-type conductivity type and has a peak dopant concentration approximately the same as the peak dopant concentration of semiconductor substrate 21. In some examples, semiconductor region 24 has a generally small thickness in a range from about 1 micron to about 3 microns or more. Because of the small thickness and the high dopant concentration of semiconductor region 24, when semiconductor device 10 receives a positive voltage from terminal 11 to terminal 12, the voltage causes the carrier concentration to be confined to a small and high-density area within semiconductor region 24 and near to the interface with semiconductor substrate 21. This high concentration of carriers and dopants provides Zener diode operating characteristics to the diode formed between semiconductor substrate 21 and semiconductor region 24 thereby forming Zener diode 14. This combination also provides Zener diode 14 with a very sharp breakdown or knee and allows very accurate control over the breakdown voltage or Zener voltage of diode 14. The breakdown voltage or Zener voltage of diode 14 can be adjusted by changing the carrier concentration of semiconductor region 24 and/or semiconductor substrate 21. Zener breakdown voltage is considerably more controllable as compared to device using punch-through breakdown voltage.

In the present example, semiconductor region 32 has a P-type conductivity type and a peak dopant concentration in a range from about $1.0 \times 10^{16}$ atoms/cm$^3$ to about $1.0 \times 10^{17}$ atoms/cm$^3$. In some examples, other concentrations can be used. In some examples, the peak dopant concentration of semiconductor region 32 is less than the peak dopant concentration of semiconductor region 24. In some examples, the dopant concentration of semiconductor region 32 can be selected to adjust the blocking voltage characteristics of diode 17.

In accordance with the present description, both semiconductor region 24 and semiconductor region 32 are formed on or within semiconductor substrate 21 using masking and doping techniques as known to one or ordinary skill in the art. In some examples, a first masking layer can be provided over semiconductor substrate 21 leaving a first area for semiconductor region 24 exposed. N-type dopant can then be provided for semiconductor region 24 using, for example, ion implantation techniques. A second masking layer can then be provided over semiconductor substrate 21 leaving a second area for semiconductor region 32 exposed. P-type dopant can then be provided for semiconductor region 32 using, for example, ion implantation techniques.

After dopants for both semiconductor region 24 and semiconductor region 32 are provided, semiconductor layer 27 can be formed over semiconductor region 24 and semiconductor region 32 using epitaxial growth techniques. When epitaxial growth techniques are used to form semiconductor layer 27, the dopants in semiconductor region 24 and semiconductor region 32 out-diffuse and provide a dopant source for increasing the dopant concentration of semiconductor layer 27. That is, semiconductor layer 27 is auto-doped by semiconductor regions 24 and 32. The out-diffusion of N-type conductivity dopant from semiconductor region 24 provides an N-type conductivity semiconductor region 211 and the out-diffusion of P-type conductivity dopant from semiconductor region 32 provides a P-type conductivity semiconductor region 212. More particularly, semiconductor layer includes semiconductor region 211 and semiconductor region 212, which are laterally adjacent to each other.

Subsequently, isolation structures 29 and 31 are formed to isolate the portion of semiconductor region 211 where diode 13 is to be formed from the portion of semiconductor region 212 where diode 17 is to be formed. In some examples, isolation structures 29 and 31 can be isolation trenches and can be referred to as isolation trenches 29 and 31. Isolation trenches 29 and 31 generally are formed by creating openings from a top side of semiconductor layer 27, through semiconductor layer 27, through semiconductor regions 24 and 32, and extending into semiconductor substrate 21. Isolation trenches 29 and 31 can be formed using photolithography and etch techniques or other techniques as known to one of ordinary skill in the art.

The configuration of isolation trenches 29 and 31 reduces or prevents lateral conduction between semiconductor regions 24, 32, 211, and 212 and diodes 13, 14 and 17. Isolation trenches 29 and 31 can include a dielectric liner 30 along the sidewalls and bottoms of trenches 29 and 31 and filling the remaining opening with a dielectric or with doped or undoped polysilicon. Alternately, dielectric liner 30 may be formed along the sidewalls but not bottom of trenches 29 and 31. Isolation trench 29 preferably forms a closed polygon with a periphery that has an opening that encloses a portion of semiconductor region 211. Isolation trench 31 preferably forms a closed polygon with a periphery that has an opening that encloses a portion of semiconductor region 212. Each of isolation trench 29 and isolation trench 31 may be regarded as a multiply-connected domain.

Semiconductor region 24 is positioned such that it extends between the outside edges of isolation trench 29 but terminates before the outside edge of trench 31. This configuration assists in using semiconductor region 24 to form a continuous Zener diode 14 and to ensure semiconductor region 24 does not extend into semiconductor region 212 or semiconductor region 32 underlying diode 17. Semiconductor region 32 is positioned such that it extends between the outside edges of isolation trench 31 but terminates before the outside edge of isolation trench 29. This configuration ensures that semiconductor region 32 does not extend into semiconductor region 211 or semiconductor region 24.

Semiconductor device 10 includes a doped region 33 that is formed at the top side of semiconductor layer 27 within semiconductor region 211. Doped region 33 forms a P-N junction with semiconductor region 211 and forms a junction for diode 13. Doped region 33 has a P-type conductivity type and extends into semiconductor region 211 and overlies semiconductor region 24. Doped region 33 is positioned within semiconductor region 211 such that isolation trench 29 completely surrounds doped region 33. In some examples, isolation trench 29 is a single continuous trench isolation that is formed around doped region 33. The peak dopant concentration of doped region 33 is greater than the peak dopant concentration of semiconductor region 211 and can be approximately equal to the peak dopant concentration of semiconductor substrate 21. In some examples, doped region 33 extends into semiconductor region 211 a distance less than about 2 microns. In some examples, the distance is between 0.1 microns and 2 microns from the top side of semiconductor layer 27. The large differential dopant concentration between doped region 33 and semiconductor region 211, the small area, and the shallow depth of doped region 33 help to provide diode 13 with a very small capacitance. As described previously, the very small capacitance of diode 13 under zero bias conditions assists in forming a small zero capacitance for semiconductor device 10.

Doped region 33 is separated from semiconductor region 24 by a distance that assists in minimizing the capacitance of diode 14. The spacing generally is approximately 2 microns to 20 microns. The portion of semiconductor region 211 that is between doped region 33 and semiconductor region 24 forms a drift portion of diode 13. The thickness of the drift portion generally is at least around 2 microns to reduce the formation of parasitic transistor action and to ensure that semiconductor device 10 does not operate in a punch-through operating region.

A doped region 34 is formed within semiconductor region 212 and has an N-type conductivity type. Doped region 34 forms a P-N junction with semiconductor region 212 and provides a junction for diode 17. The peak dopant concentration of doped region 34 is greater than the peak dopant concentration of semiconductor region 212, and preferably is approximately equal to the peak dopant concentration of semiconductor substrate 21. In some examples, doped region 34 is formed at the top side of semiconductor layer 27 within semiconductor region 212 and extends approximately the same distance into semiconductor region 212 as doped region 33 extends into semiconductor region 211. Doped region 34 overlies semiconductor region 32 and is positioned so that the periphery of doped region 34 at the top side of semiconductor layer 27 is completely surrounded by isolation trench 31. In some examples, isolation trench 31 is one continuous trench. The low carrier concentration of semiconductor region 212 and the shallow depth of doped region 34 assist in providing diode 17 with a very small capacitance. As described previously, the very small capacitance of diode 17 under zero bias conditions assists in forming a small zero bias capacitance for semiconductor device 10.

Semiconductor device 10 further includes a dielectric 36 over the top side of semiconductor layer 27. Dielectric 36 can be provided prior to the formation of doped regions 33 and 34 and can comprise one or more dielectric layers including for example, a field dielectric layer and a pre-ohmic dielectric layer. In some examples, dielectric 36 comprises an oxide, a nitride, combinations thereof, or other dielectrics as known to one of ordinary skill the art. Dielectric 36 can be provided using thermal growth processes or chemical vapor deposition processes. Dielectric 36 can be patterned to provide openings for doped regions 33 and 34 using, for example, photolithographic and etch processes.

Semiconductor device 10 further includes a conductor 38 over dielectric 36 that makes contact or is coupled to doped regions 33 and 34 through openings in dielectric 36. In some examples, conductor 38 comprises one or more metals or metal layers. In some examples, conductor 38 can comprise an aluminum alloy, such as aluminum (Al)-silicon (Si)-copper (Cu) alloy. In some examples, a solderable material or sintering material is provided over the aluminum alloy. In other examples, conductor 38 can comprise titanium (Ti) nickel (Ni) silver (Ag) or chromium (Cr) Ni gold (Au). Conductor 38 can be formed using evaporation, sputtering, or other deposition techniques. In some examples, conductor 38 has a thickness between about 2 microns and 9 microns. Conductor 38 provides terminal 11 for semiconductor device 10 as illustrated in FIG. 1

In a subsequent fabrication step, a portion of the back side of semiconductor substrate 21 is removed to reduce the overall thickness of semiconductor substrate 21. In some examples, a back grinding and etching process is used to remove a portion of semiconductor substrate 21 from the back side. In some examples, the thickness of semiconductor substrate 21 and semiconductor layer 27 after the removal process can between about 100 microns and about 200 microns. In other examples, the thickness can be less than 100 microns or more than 200 microns.

Figure 2B:
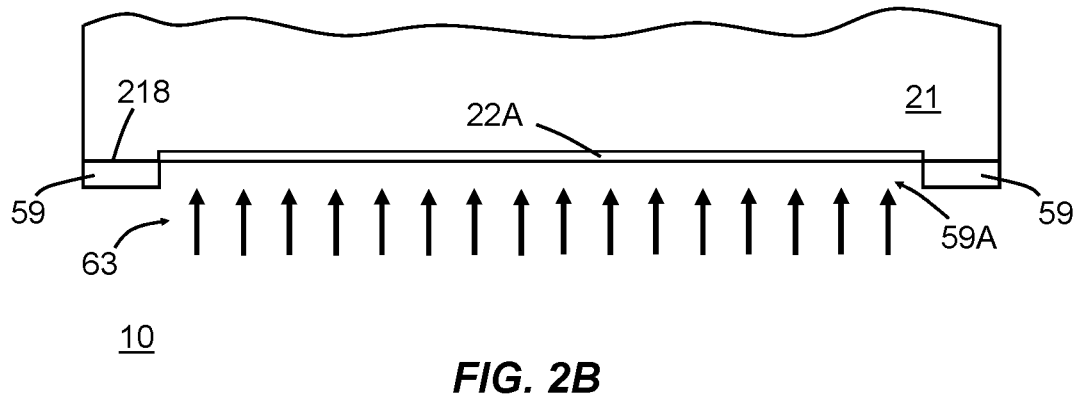
FIGS. 2B and 2C illustrate partial cross-sectional view of the semiconductor device of FIG. 2A at steps in fabrication including alternate embodiments in accordance with the present description.
Figure 2C:
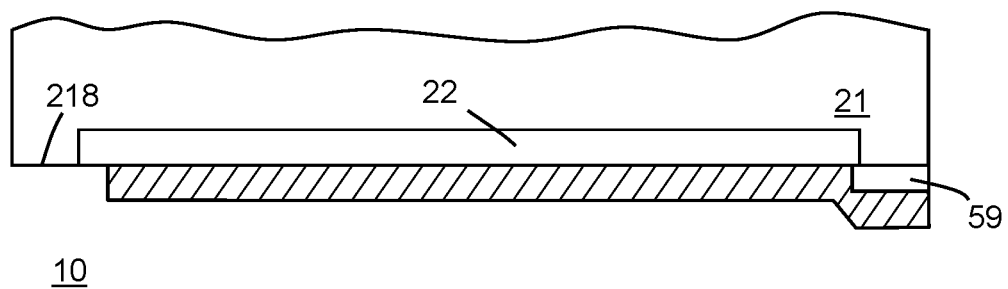

FIGS. 2B and 2C illustrate a portion of semiconductor substrate 21 after semiconductor substrate 21 is reduced in thickness and after additional processing to form doped region 22. In the present example, doped region 22 is an N-type conductivity type region that forms a P-N junction with semiconductor substrate 21 and provides a junction for Zener diode 18. In accordance with the present description, a mask 59 is provided over back side 218 of semiconductor substrate 21 and is provided with an opening 59A for forming doped region 22. In some examples, mask 59 can be a photoresist layer or other deposited masking materials. Mask 59 can be provided using double-sided alignment photolithographic tools that effectively align opening 59A of mask 59 to the structures on the top side of semiconductor layer 27. In this way the dopant used to form doped region 22 is aligned to semiconductor regions 24 and 32. In some examples, the thickness of mask 59 is selected to block dopant that is used to form doped region 22.

In some examples, one or more low energy ion implants (generally represented by arrows 63) are used to form an implanted region 22A at back side 218 within opening 59A as generally illustrated in FIG. 2B. In accordance with the present description, the ion implant dose is selected so that the peak dopant concentration of doped region 22 is approximately the same as the peak dopant concentration of semiconductor substrate 21. In some examples, an N-type dopant is ion implanted into back side 218 at an ion implant energy of 100 keV or more. In some examples, phosphorus or arsenic is ion implanted at dose between about $1.0 \times 10^{15}$ atoms/cm$^2$ to $1.0 \times 10^{16}$ atoms/cm$^2$ or more. In some examples, different doses and/or implant energies can be used in a multiple ion implant process. After the dopant is implanted, mask 59 can be removed and a thermal treatment can be used to activate and diffuse the N-type dopant into semiconductor substrate 21 to form doped region 22. In some examples, a laser anneal process can be used to activate and diffuse the N-type dopant to form doped region 22. In some examples, doped region 22 extends a distance into semiconductor substrate of about 0.2 microns to about 3 micron or more after the thermal treatment. Because of the small thickness and the high dopant concentration of doped region 22, when semiconductor device 10 receives a negative voltage from terminal 11 to terminal 12, the voltage causes the carrier concentration to be confined to a small and high-density area within doped region 22 and near the interface with semiconductor substrate 21. This high concentration of carriers and dopants provides Zener diode operating characteristics to the diode formed between semiconductor substrate 21 and doped region 22 thereby forming Zener diode 18. This combination also provides Zener diode 18 with a very sharp breakdown or knee and allows very accurate control over the breakdown voltage or Zener voltage of diode 18. The breakdown voltage or Zener voltage of diode 18 can be adjusted by changing the carrier concentration of doped region 22 and/or semiconductor substrate 21. As set forth previously, Zener breakdown voltage is considerably more controllable as compared to device using punch-through breakdown voltage.

In accordance with the present description, doped region 22 is a patterned region that is inset or laterally spaced inwards from the edges of semiconductor device 10 as illustrated in FIGS. 2A-2C. That is, doped region 22 does not laterally extend completely to the edges of semiconductor substrate 21. In some examples, mask 59 can remain in place over back side 218 of semiconductor substrate 21 to provide further isolation of doped region 22. Doped region 22 underlies both semiconductor region 24 and semiconductor region 32 and is separated from semiconductor region 24 and semiconductor region 32 by semiconductor substrate 21. In accordance with the present description, doped region 22 has width that is larger than the width of semiconductor region 24 as illustrated in FIG. 2A.

Semiconductor device 10 further includes a conductor 39 formed at back side 218 adjacent to doped region 22. In some examples, conductor 39 can comprise Al—Ni-vanadium (V)—Au and can be formed evaporation, sputtering, or other deposition techniques as known to one of ordinary skill in the art. In other examples, Ti—Ni—Ag, Al—Ni—Ag, or Cr—Ni—Au can be used. In some examples, conductor 39 has a thickness in a range from about 1 micron to about 4 microns. Conductor 39 provides a terminal 12 for semiconductor device 10 as illustrated in FIG. 1.

In some examples, conductor 39 has a smaller width than doped region 22 as illustrated in FIG. 2A. That is, conductor 39 can be inset with respect to the edges of doped region 22. In this way, conductor 39 does not short the P-N junction that forms Zener diode 18. This is further illustrated in the left portion of FIG. 2C. In other examples, mask 59 can be left in place to isolate the P-N junction that forms Zener diode 18, and conductor 39 can extend to overlap at least a portion of mask 59 as illustrated in the right portion of FIG. 2C. In some examples where mask 59 remains over back side 218 of semiconductor substrate 21, mask 59 can be an organic polymer film, such as polyimide or other materials as known to one of ordinary skill in the art. Double-sided photolithography techniques can be used to form conductor 39. In some examples, conductor 39 is a patterned conductor on back side 218 of semiconductor device 10.

In accordance with the present description, diodes 13 and 17 can have low capacitance to provide an overall low capacitance for semiconductor device 10. Zener diodes 14 and 18 can be larger area diodes to sustain positive and negative ESD events. More particularly, the area of Zener diode 18 (which is a patterned back-side diode for semiconductor device 10) is advantageously close to the area of semiconductor device 10 to provide enhanced ESD protection for the selected size of semiconductor device 10. During a positive ESD pulse, diode 13 steers the positive pulse through the buried Zener diode 14. Diode 17 blocks the positive pulse. Zener diode 18 adds a forward voltage drop to the breakdown voltage of Zener diode 14. During a negative ESD pulse, diode 17 steers the negative pulse through Zener diode 18. Diode 13 blocks the negative pulse.

Among other things, semiconductor device 10 provides a bi-directional ESD device within a single semiconductor die that has a smaller die size compared to previous devices that required two die, which supports smaller packages. In addition, semiconductor device 10 reduces the number of required packaging interconnects, for example, from two interconnects to one interconnect. Semiconductor device 10 provides additional design freedom and improves the negative side of ESD performance without significantly increasing capacitance. In addition, the breakdown voltage of the negative side of semiconductor device 10 can be adjusted based on the dopant concentrations of semiconductor substrate 21 and doped region 22. This is an improvement over previous ESD devices.

Figure 3:
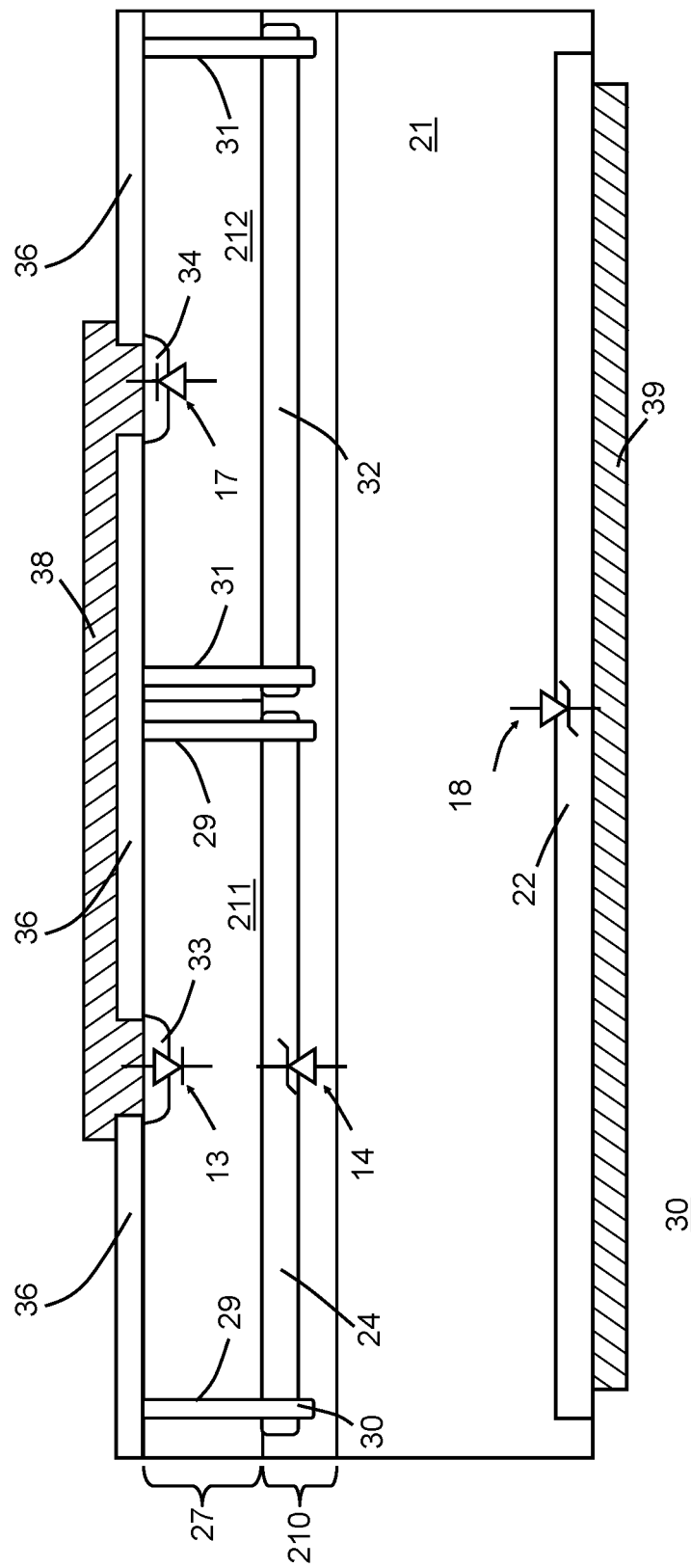
FIG. 3 illustrates a cross-sectional view of a semiconductor device in accordance with the present description.

FIG. 3 illustrates a cross-sectional view of a semiconductor device 30 configured as a bi-directional ESD device within a single semiconductor die in accordance with the present description. Semiconductor device 30 is similar to device 10 and only the differences between the devices are described. Semiconductor device 30 includes a semiconductor layer 210 interposed between semiconductor layer 27 and semiconductor substrate 21. In this example, semiconductor regions 24 and 32 are formed within semiconductor layer 210. In some examples, semiconductor layer 210 has the same conductivity type as semiconductor substrate 21 (in this example, a P-type conductivity), and can have a peak dopant concentration that is different than the peak dopant concentration of semiconductor substrate 21. In some examples, the peak dopant concentration of semiconductor layer 210 is less than the peak dopant concentration of semiconductor substrate 21. In some examples, semiconductor layer 210 is formed using epitaxial growth techniques, and can have a thickness that is selected so that semiconductor regions 24 and 32 do not extend through semiconductor layer 210 into semiconductor substrate 21. In this way semiconductor layer 210 can be used to adjust the characteristics of the breakdown voltage of Zener diode 14.

Figure 4:
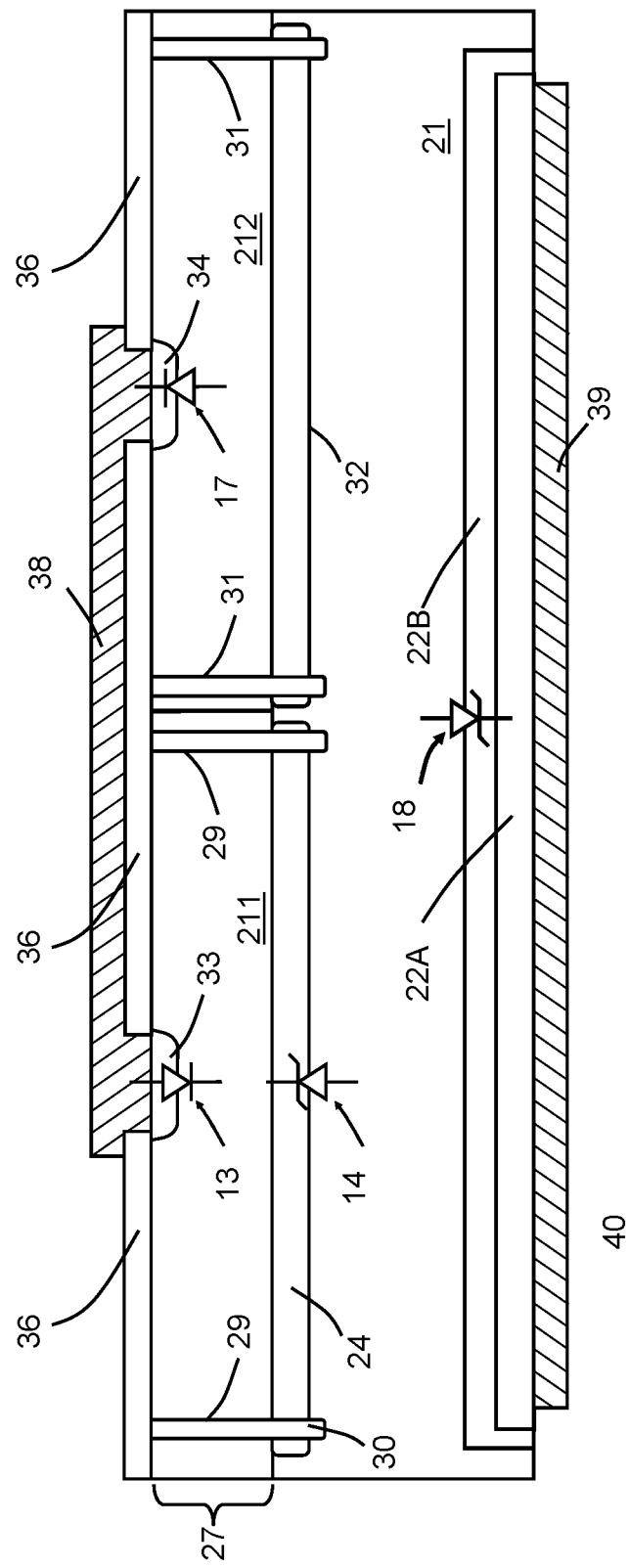
FIG. 4. illustrates a cross-sectional view of a semiconductor device in accordance with the present description.

FIG. 4 illustrates a cross-sectional view of a semiconductor device 40 configured as a bi-directional ESD device within a single semiconductor die in accordance with the present description. Semiconductor device 40 is similar to semiconductor device 10 and only the differences between the devices are described. In semiconductor device 40, doped region 22 includes multiple portions (e.g., portions 22A and 22B) to form doped region 22 at the back side of semiconductor substrate 21. Portion 22B extends inward from the bottom side of semiconductor substrate 21 a distance that is greater than the distance portion 22A extends inward. In some examples, portion 22B has a different peak dopant concentration than the peak dopant concentration of portion 22A. In some examples, the peak dopant concentration of portion 22B is less than the peak dopant concentration of portion 22A. Portion 22B forms a P-N junction with semiconductor substrate 21 to provide Zener diode 18. The multiple portions for doped region 22 can be used to adjust the characteristics of the breakdown voltage of Zener diode 18.

Figure 5:
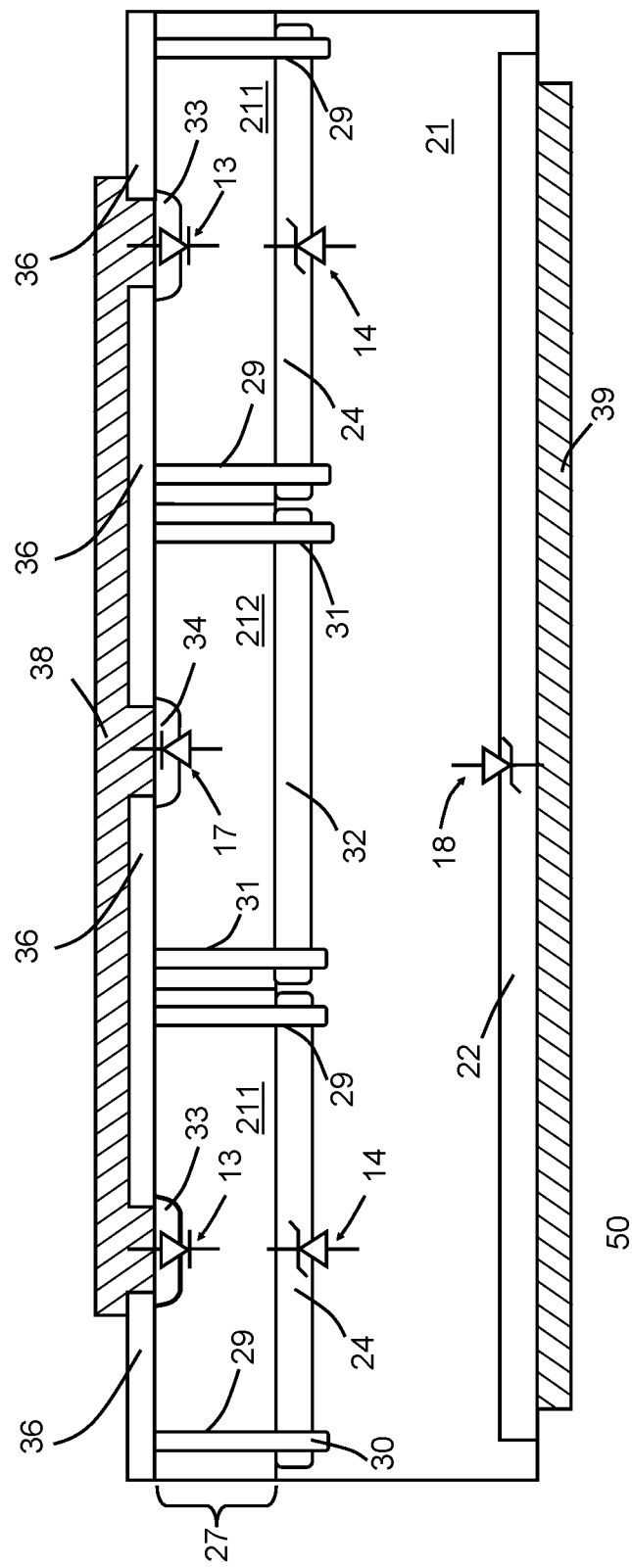
FIG. 5 illustrates a cross-sectional view of a semiconductor device in accordance with the present description.
Figure 6:
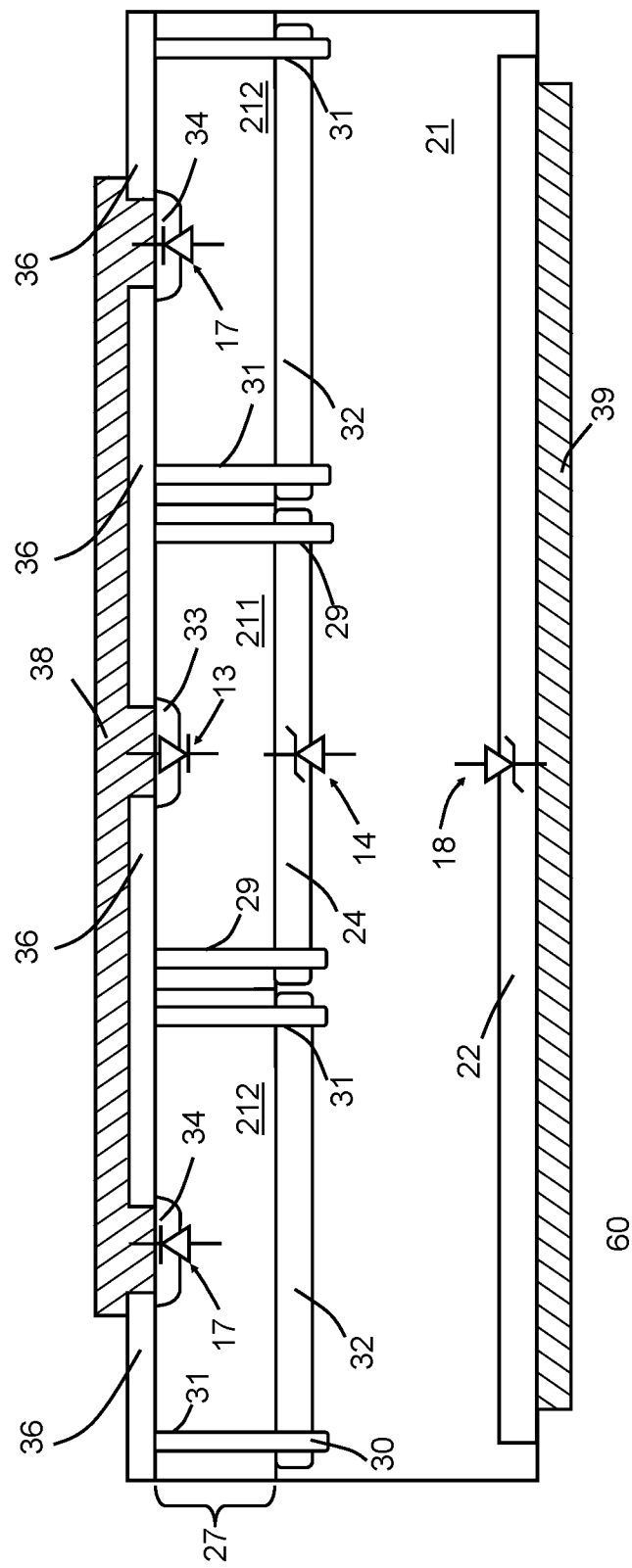
FIG. 6 illustrates a cross-sectional view of a semiconductor device in accordance with the present description.

FIG. 5 illustrates a cross-sectional view of a semiconductor device 50 configured as a bi-directional ESD device and FIG. 6 illustrates a cross-sectional view of a semiconductor device 60 configured as a bi-directional ESD device both within a single semiconductor die in accordance with the present description. Semiconductor device 50 and semiconductor device 60 are similar to semiconductor device 10 and only the differences between the devices will be described. Semiconductor device 50 comprises an annular ring configuration where semiconductor region 24 and doped region 33 are provided as ring shapes or structures that surround semiconductor region 32 and doped region 34. That is, semiconductor region 32 and doped region 34 are provided in a central portion of semiconductor layer 27 and semiconductor region 24 and doped region 33 are provided as rings that surround semiconductor region 32 and doped region 34. In some examples, semiconductor region 32 and doped region 34 can have circular shapes. In this way, semiconductor device 50 is configured to distribute current more evenly during an ESD event.

Semiconductor device 60 comprise annular ring configuration where semiconductor region 32 and doped region 34 are provided as ring shapes or structures that surround semiconductor region 24 and doped region 33. That is, semiconductor region 24 and doped region 33 are provided in central portion of semiconductor layer 27 and semiconductor region 32 and doped region 34 are provided as rings that surround semiconductor region 24 and doped region 33. In some examples, semiconductor region 24 and doped region 33 can have circular shapes. In this way, semiconductor device 60 is configured to distribute current more evenly during an ESD event. In some examples of semiconductor devices 50 and 60, diode 18 can also have a circular shape. In other examples, diode 18 has a rectangular shape with rounded corners to reduce electric field crowding and premature breakdown.

It is understood that the different examples described herein can be combined with any of the other examples described herein to obtain different embodiments.

In addition, it is understood that different semiconductor materials can be selected for semiconductor substrate 21 and semiconductor layer 27. In some examples, both semiconductor substrate 21 and semiconductor layer 27 can be silicon. However, the present description is relevant to other materials including other heterojunction semiconductor materials, such as SiGe, SiGeC, GaAs, InGaP, GaN, and AlN. Further, semiconductor substrate and semiconductor layers 27 (and semiconductor layer 210) can be the same or different materials.

While the subject matter of the invention is described with specific preferred examples, the foregoing drawings and descriptions thereof depict only typical examples of the subject matter and are not therefore to be considered limiting of its scope. It is evident that many alternatives and variations will be apparent to those skilled in the art. For example, the conductivity types of the various regions can be reversed. In addition, other edge termination structures can be incorporated. Further, other isolation techniques can be used to isolate diodes 13, 14, and 17 as well as diode 18. It is understood that the term semiconductor substrate can refer to an individual semiconductor die, a plurality of semiconductor die, or a semiconductor wafer.

As the claims hereinafter reflect, inventive aspects may lie in less than all features of a single foregoing disclosed example. Thus, the hereinafter expressed claims are hereby expressly incorporated into this Detailed Description of the Drawings, with each claim standing on its own as a separate example of the invention. Furthermore, while some examples described herein include some, but not other features included in other examples, combinations of features of different examples are meant to be within the scope of the invention and meant to form different examples as would be understood by those skilled in the art.

What is claimed is:

1. A semiconductor device, comprising:
a first terminal;
a second terminal;
a first P-N diode having an anode coupled to the first terminal and a cathode;
a first Zener diode in a series combination with the first P-N diode having a cathode coupled to the cathode of the first P-N diode and an anode;
a second P-N diode coupled in parallel with the series combination of the first P-N diode and the first Zener diode, the second P-N diode having a cathode coupled to the first terminal and an anode; and
a second Zener diode having a cathode coupled to the second terminal and an anode, the anode of the second Zener diode coupled to the anode of the second P-N diode and coupled to the anode of the first Zener diode;
wherein the semiconductor device comprises:
a semiconductor substrate of a first conductivity type having a first peak dopant concentration no less than approximately $1.0 \times 10^{19}$ atoms/cm$^3$;
a first semiconductor region of a second conductivity type opposite to the first conductivity type and having approximately the first peak dopant concentration, wherein:
the first semiconductor region forms a first P-N junction with the semiconductor substrate; and
the first P-N junction forms a junction of the first Zener diode;
a second semiconductor region of the second conductivity type on the first semiconductor region, wherein the second semiconductor region has a second peak dopant concentration that is less than the first peak dopant concentration;
a first doped region of the first conductivity type in the second semiconductor region and overlying the first semiconductor region;
a third semiconductor region laterally adjacent to the first semiconductor region and having the first conductivity type and a third peak dopant concentration;
a fourth semiconductor region of the first conductivity type on the third semiconductor region having a fourth peak dopant concentration that is less than the third peak dopant concentration;

a second doped region of the second conductivity type in the fourth semiconductor region and overlying the third semiconductor region; and a third doped region of the second conductivity type contiguous with a bottom side of the semiconductor substrate and the second terminal, wherein the third doped region comprises approximately the first peak dopant concentration to provide a second P-N junction with the semiconductor substrate, and wherein the second P-N junction forms a junction of the second Zener diode.

2. The semiconductor device of claim 1, wherein:
the third doped region is a patterned region that is inset from edges of the semiconductor substrate; and
the first semiconductor region is at least partially within the semiconductor substrate.

3. The semiconductor device of claim 1, wherein:
the first doped region and the second doped region have approximately the first peak dopant concentration.

4. The semiconductor device of claim 1, wherein:
the first doped region is spaced a distance of at least two microns from the first semiconductor region.

5. The semiconductor device of claim 1, further comprising:
an isolation structure isolating the first semiconductor region, the second semiconductor region and the first doped region from the third semiconductor region and the second doped region.

6. The semiconductor device of claim 5, wherein:
the isolation structure comprises:
a first isolation trench extending from a top side of the second semiconductor region, through the first semiconductor region into the semiconductor substrate; and
a second isolation trench extending from a top side of the fourth semiconductor region, through the third semiconductor region into the semiconductor substrate;
wherein:
the first isolation trench surrounds the first doped region; and
the second isolation trench surrounds the second doped region.

7. The semiconductor device of claim 1, wherein:
the first semiconductor region has a first width;
the third doped region has a second width; and
the second width is greater than the first width.

8. The semiconductor device of claim 1, wherein:
the second terminal is coupled to the third doped region at the bottom side of the semiconductor substrate;
the third doped region has a first width;
the second terminal has a second width; and
the second width is less than the first width.

9. The semiconductor device of claim 1, wherein:
the semiconductor substrate has a semiconductor layer of the first conductivity type on the semiconductor substrate;
the semiconductor layer has a peak dopant concentration less than the first peak dopant concentration;
the first semiconductor region and the second semiconductor region are within the semiconductor layer;
a portion of the semiconductor layer is interposed between the first semiconductor region and the second semiconductor region and the semiconductor substrate; and
the first semiconductor region forms the first P-N junction with the semiconductor layer.

10. The semiconductor device of claim 1, wherein:
the first semiconductor region surrounds the third semiconductor region.

11. The semiconductor device of claim 1, wherein:
the third semiconductor region surrounds the first semiconductor region.

12. The semiconductor device of claim 1, wherein:
the third doped region comprises:
a first portion that extends from the bottom side of the semiconductor substrate a first distance; and
a second portion that extends from the bottom side of the semiconductor substrate a second distance;
the first distance is greater the second distance;
the second portion has approximately the first peak dopant concentration;
the first portion has a peak dopant concentration that is less than the first peak dopant concentration; and
the first portion forms the second P-N junction with the semiconductor substrate.

13. A semiconductor device, comprising:
a semiconductor substrate of a first conductivity type having a first peak dopant concentration, a top side, and a bottom side opposite to the top side;
a first semiconductor region of a second conductivity type opposite to the first conductivity type at a first portion of the top side, wherein:
the first semiconductor region has approximately the first peak dopant concentration and forms a first P-N junction with the semiconductor substrate; and
the first P-N junction forms a junction of a first Zener diode;
a second semiconductor region of the second conductivity type overlying the first semiconductor region, and has a second peak dopant concentration less than the first peak dopant concentration;
a first doped region of the first conductivity type in the second semiconductor region and overlying the first semiconductor region, wherein the first doped region forms a second P-N junction with the second semiconductor region;
a third semiconductor region at a second portion of the top side laterally adjacent to the first semiconductor region and having the first conductivity type and a third peak dopant concentration;
a fourth semiconductor region of the first conductivity type overlying the third semiconductor region and having a fourth peak dopant concentration less than the third peak dopant concentration;
a second doped region of the second conductivity type in the fourth semiconductor region and overlying the third semiconductor region, wherein the second doped region forms a third P-N junction with the fourth semiconductor region;
a third doped region of the second conductivity type contiguous with the bottom side and having approximately the first peak dopant concentration, the third doped region forms a fourth P-N junction with the semiconductor substrate, wherein the fourth P-N junction forms a junction of a second Zener diode;
a first conductor coupled to the first doped region and the second doped region at the top side; and
a second conductor contiguous with the third doped region and the bottom side of the semiconductor substrate.

14. The semiconductor device of claim 13, wherein:
the first doped region has a first width;
the second doped region has a second width;

the first semiconductor region has a third width;
the third doped region has a fourth width;
the third width and the fourth width are greater than the first width and the second width; and
the fourth width is greater than the third width.

15. The semiconductor device of claim 13, wherein:
the third doped region is a patterned region; and
the third peak dopant concentration is less than the first peak dopant concentration.

16. The semiconductor device of claim 13, wherein:
the first peak dopant concentration is greater than or equal to approximately $1.0 \times 10^{19}$ atoms/cm$^3$.

17. The semiconductor device of claim 13, further comprising:
an isolation structure isolating the first semiconductor region, the second semiconductor region and the first doped region from the third semiconductor region and the second doped region.

18. A method of forming a semiconductor device, comprising:
providing a semiconductor substrate of a first conductivity type having a first peak dopant concentration, a top side, and a bottom side opposite to the top side;
providing a first semiconductor region of a second conductivity type opposite to the first conductivity type at a first portion of the top side, wherein:
the first semiconductor region has approximately the first peak dopant concentration and forms a first P-N junction with the semiconductor substrate; and
the first P-N junction forms a junction of a first Zener diode;
providing a second semiconductor region of the first conductivity type having a second peak dopant concentration at a second portion of the top side and laterally adjacent to the first semiconductor region;
providing a third semiconductor region of the second conductivity type overlying the first semiconductor region and a fourth semiconductor region of the first conductivity type overlying the second semiconductor region, wherein:
the third semiconductor region has a third peak dopant concentration that is less than the first peak dopant concentration; and
the fourth semiconductor region has a fourth peak dopant concentration that is less than the second peak dopant concentration;
providing a first doped region of the first conductivity type in the third semiconductor region and overlying the first semiconductor region, wherein the first doped region forms a second P-N junction with the third semiconductor region;
providing a second doped region of the second conductivity type in the fourth semiconductor region and overlying the second semiconductor region, wherein the second doped region forms a third P-N junction with the fourth semiconductor region;
providing a first conductor coupled to the first doped region and the second doped region;
providing a third doped region of the second conductivity type contiguous with the bottom side of the semiconductor substrate and having approximately the first peak dopant concentration to provide a fourth P-N junction with the semiconductor substrate, wherein the fourth P-N junction forms a junction of a second Zener diode; and
providing a second conductor contiguous with the third doped region and the bottom side of the semiconductor substrate.

19. The method of claim 18, wherein providing the third doped region comprises:
forming a mask over the bottom side of the semiconductor substrate, the mask having an opening; and
ion implanting dopant of the second conductivity type into the bottom side of the semiconductor substrate through the opening.

20. The method of claim 19, wherein:
the ion implanting dopant comprises using more than one ion implant dose.

* * * * *